United States Patent
Sasaki et al.

[11] Patent Number: 5,931,686
[45] Date of Patent: Aug. 3, 1999

[54] BACKPLANE CONNECTOR AND METHOD OF ASSEMBLY THEREOF TO A BACKPLANE

[75] Inventors: Takinori Sasaki, Hadano; Yukiharu Tayama; Takahiro Matsuda, both of Tokyo, all of Japan

[73] Assignee: The Whitaker Corporation, Wilmington, Del.

[21] Appl. No.: 08/945,911

[22] PCT Filed: Apr. 9, 1996

[86] PCT No.: PCT/US96/06115

§ 371 Date: Oct. 24, 1997

§ 102(e) Date: Oct. 24, 1997

[87] PCT Pub. No.: WO96/34431

PCT Pub. Date: Oct. 31, 1996

[30] Foreign Application Priority Data

Apr. 28, 1995 [JP] Japan ................................. 7-105767

[51] Int. Cl.[6] ............................................. H01R 9/09
[52] U.S. Cl. ....................................... 439/78; 439/545
[58] Field of Search .......................... 439/78, 572, 545

[56] References Cited

U.S. PATENT DOCUMENTS

| | | | |
|---|---|---|---|
| 4,674,812 | 6/1987 | Thom et al. | 439/78 |
| 4,686,607 | 8/1987 | Johnson | 361/413 |
| 4,871,320 | 10/1989 | Mouissie | 439/78 |
| 4,998,887 | 3/1991 | Kaufman et al. | 439/78 |
| 5,259,773 | 11/1993 | Champion et al. | 439/108 |

FOREIGN PATENT DOCUMENTS

| | | | |
|---|---|---|---|
| 0 347 097 A1 | 12/1989 | European Pat. Off. | H01R 23/68 |
| 0 545 502 A1 | 6/1993 | European Pat. Off. | H01R 23/68 |

*Primary Examiner*—Neil Abrams
*Assistant Examiner*—T C Patel
*Attorney, Agent, or Firm*—Anton P. Ness

[57] ABSTRACT

Back panel assembly 100 consisting of back panel 110, first header connectors 80 mounted on one side 112 of the back panel 110, and second header connectors 120 mounted on the other side 114. Due to the fact that the lengthwise edges of the pin header 124 of the second header connectors 120 fit into the spaces 82,84 of the header connectors 80, it is possible to increase connector density. Since the side wall unit 60 can be removed from the base unit 40, press-fit pins 22 can be easily replaced. The side wall unit 60 may be floatably mounted to base unit 40.

14 Claims, 13 Drawing Sheets

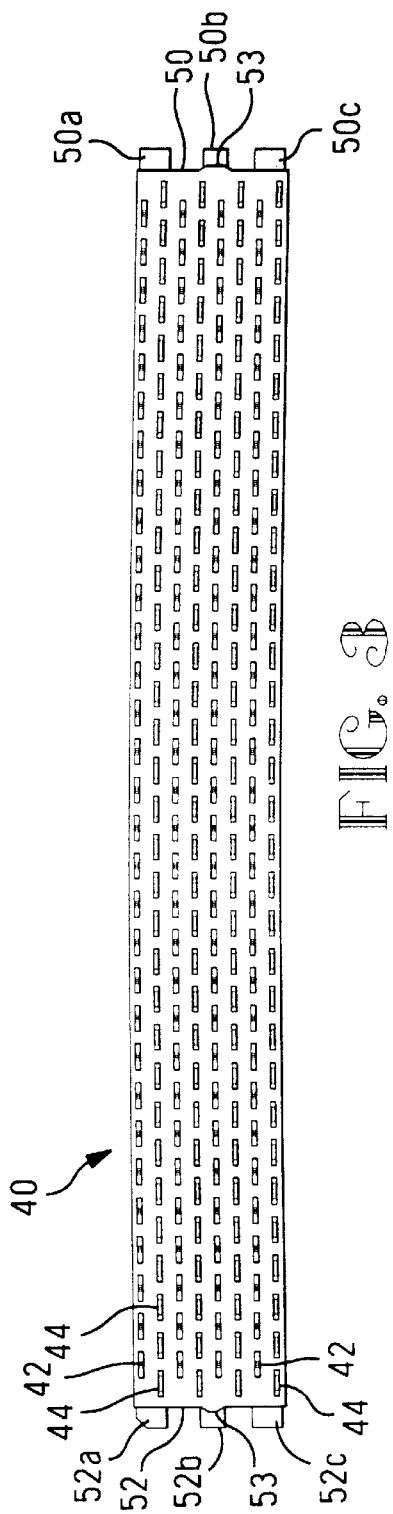
FIG. 3
FIG. 4
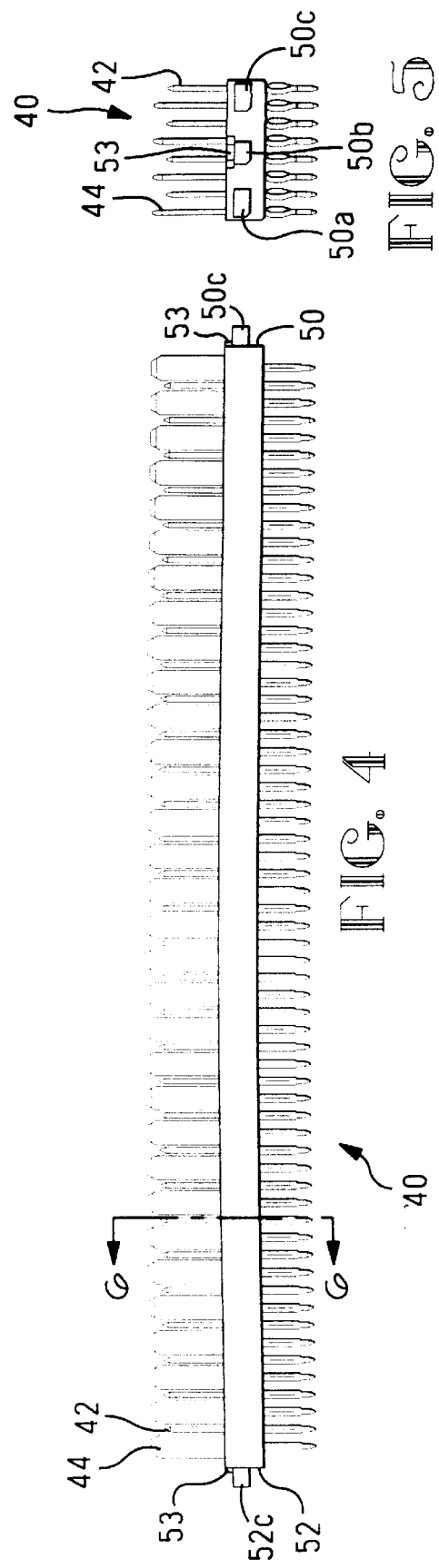
FIG. 5

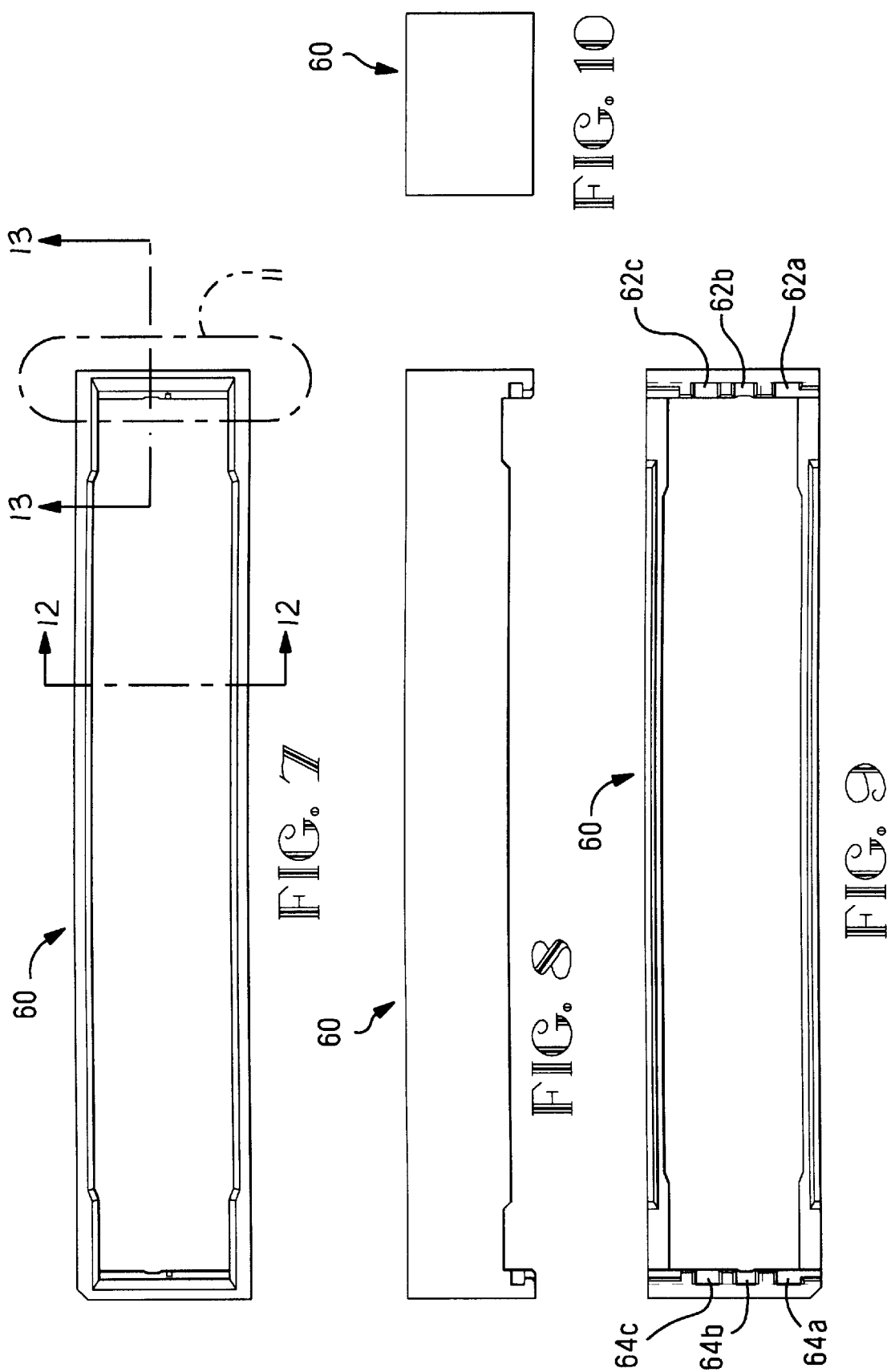

BACKPLANE CONNECTOR AND METHOD OF ASSEMBLY THEREOF TO A BACKPLANE

FIELD OF THE INVENTION

This invention relates to electrical connectors and more particularly to header connectors mounted on a backplane and to the methods of assembly of such units.

BACKGROUND OF THE INVENTION

Header connectors intended for the connection of the patterns printed on a back panel (or backplane) with external circuits by means of contacts inserted in the through holes formed in the back panel, have been used in the art for a long time. The contacts used in such header connectors are usually of a press-fit pin type or are of a compliant pin type having a spring-loaded section which can yield in the direction of the through hole diameter.

With reference to FIGS. 1 and 2, the design of a back panel assembly in which a header connector with press-fit pins is used. FIG. 1 is a partially sectioned view of a back panel assembly having header connectors mounted on its both surfaces with contacts extending in opposite directions; whereas FIG. 2 is a partially sectioned view of a back panel assembly having header connectors mounted on the both sides of the back panel, with the header connectors having common contacts.

The assembly of a double-sided back panel assembly 10 shown in FIG. 1 is carried out as follows: header connectors 16 are mounted on one side 14 of the back panel 12; after that, header connectors 20 are mounted on the other side 18 at a pre-determined pitch (see Japanese Patent Disclosure Sho 63 (1988)-228697). The assembly of a common contacts type back panel assembly 30 shown in FIG. 2 is carried out as follows: header connectors 16 are mounted on one side 14 of a back panel 12; after that, housings 32 are pressed on the ends of the press-fit pins 16a protruding from the other side 18 of the back panel.

Conventional back panel assemblies described above commonly have the following disadvantages: in the double-sided back panel assembly shown in FIG. 1, press-fit pins 16a of the header connectors 16 mounted on the one side 14 of the back panel go through the back panel 12 and extend to the other side 18 of the back panel 12. Therefore, it is necessary to select such a mounting pitch of the housings 20a of the head connectors 20 which are mounted to the other side 18 that they do not interfere with the press-fit pins 16a of the header connectors 16, thus limiting potentials for an increase in the density of the header connectors mounting.

Considerations were given to a technology making it possible to increase the mounting density of header connectors consisting in the use of press-fit pins 16a which do not extend to the other side 18. For this purpose, header connectors with press-fit pins having short contacting portions are used (not shown), and since the tips of the press-fit pins do not extend beyond the through hole, it is possible to achieve much higher mounting density of the header connectors. However, if a press-fit pin is bent and must be replaced with a good one, the bent press-fit pin can be removed from the back panel by pushing on the tip secured in the panel. Also, in the technology described above, in some cases, access to the tip of a damaged press-fit pin is blocked by another connector housing making it impossible to remove the contact from the back panel by pressing on its tip.

Another problem relates to the fact that the assembly process of a double-sided back panel assembly 10 shown in FIG. 1 is more difficult than in a case when header connectors are driven only in one direction relative to the back panel, because header connectors must be fixed to both sides 14, 18 of the back panel 12, resulting in necessity of using rather complicated jigs to support back panels 12 during the work.

Common-contact type back panel assembly 30 shown in FIG. 2 makes it possible to nearly double the mounting density of the header connectors compared to the back panel assembly 10 shown in FIG. 1. However, since the press-fit pins in opposed housings must have common functions, the devices to which the press-fit pins used for signal lines are connected at the side 14 of the back panel and to which they are connected on the other side 18, must be appropriately distributed. Therefore, the limitations imposed on the number of signal lines are even stronger than in the case of double-sided back panel assembly 10 shown in FIG. 1. As a result, the scale of the circuits which can be accommodated on a back panel with mounted header connectors is rather small, thus reducing the effectiveness of the mounting of header connectors.

The problem to be solved by this invention is to offer a header connector making it possible to replace damaged contacts, without compromising the density of connector mounting.

Another problem to be solved by this invention is to offer a back panel assembly with an increased effectiveness of the header connectors mounting.

Finally, it is the intention of this invention is to offer a method of assembly of back panel assemblies consisting of relatively easy operations.

SUMMARY OF THE INVENTION

The header connector according to this invention includes multiple pin-shaped contacts having insertion sections to be retained in through holes formed in the back panel; a low profile base unit retaining these multiple contacts passing through it; and a removable side wall unit which can be attached to the base unit, defining shroud side walls around contact sections of the multiple contacts located at the ends opposite to those to be secured in the back panel.

In one embodiment of the invention, the header connector also includes a space formed between the side edges of the base unit and the bottom surfaces of the side wall unit for the placement of a part of another connector.

In another aspect of this invention, a back panel assembly according to this invention includes a back panel having a number arrays of through holes formed in it; a first header connector secured on one side of the back panel and having multiple pin-shaped contacts inserted in a first array of said multiple holes, a low profile base Unit in which the contacts are retained in such a manner that they extend through the base unit, a removable side wall unit attached to the above mentioned base unit and running parallel to contact sections of the multiple contacts, located at the opposite end of the insertion portions, which are secured in the above mentioned base unit, and a space formed between the edges of the base unit and the edges of the side wall unit for the placement of another connector; and a second header connector consisting of a low profile pin header unit retaining ends of multiple contacts passing through a second array of multiple through holes, which occupies a part of the space of the first header connector and which is mounted on the one side of the above mentioned back panel, and a housing having a bottom wall, through which pass contact sections of the contacts retained in the pin header unit, located at the ends opposite to those secured in the above mentioned header unit, and side walls surrounding these contact sections, which housing is mounted on the other side of the back panel.

The invention will now be explained by way of reference to the drawings, in which:

BRIEF DESCRIPTION OF THE DRAWINGS

FIGS. 3 to 5 are plan, front and side views of a base unit of the header connector according to this invention and the contacts retained in this base unit;

FIGS. 7 to 10 are plan, front, bottom and side views respectively of a side wall unit of the header connector of FIGS. 3 to 6;

FIG. 12 being a section view taken through lines 12—12 of FIG. 7; and FIG. 13 being a section view taken through lines 13—13 of FIG. 7;

FIG. 15 being a cross section showing components in the process of engagement; and FIG. 16 being a cross section showing components after the engagement is completed;

DETAILED DESCRIPTION

Figure 1:
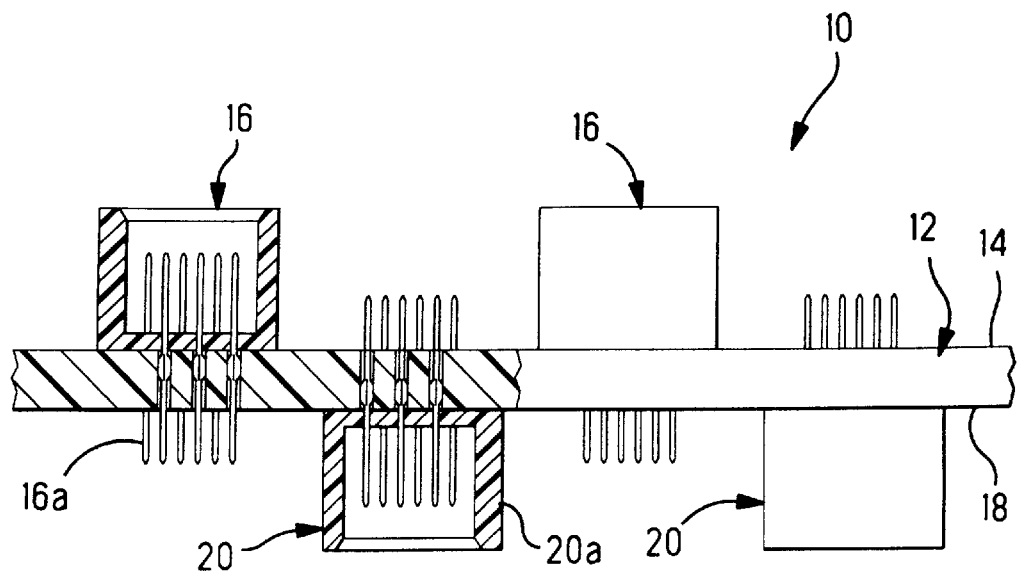
FIGS. 1 and 2 are cross-sectional views of a PRIOR ART back panel assembly using conventional header connectors, with FIG. 1 being a partially sectioned view of a back panel assembly with header connectors, of the type requiring the insertion of connectors from both sides of the back panel, and FIG. 2 being a partially sectioned view of a back panel assembly with header connectors of the type requiring the insertion of jointly used contacts from both sides of the back panel.
Figure 2:
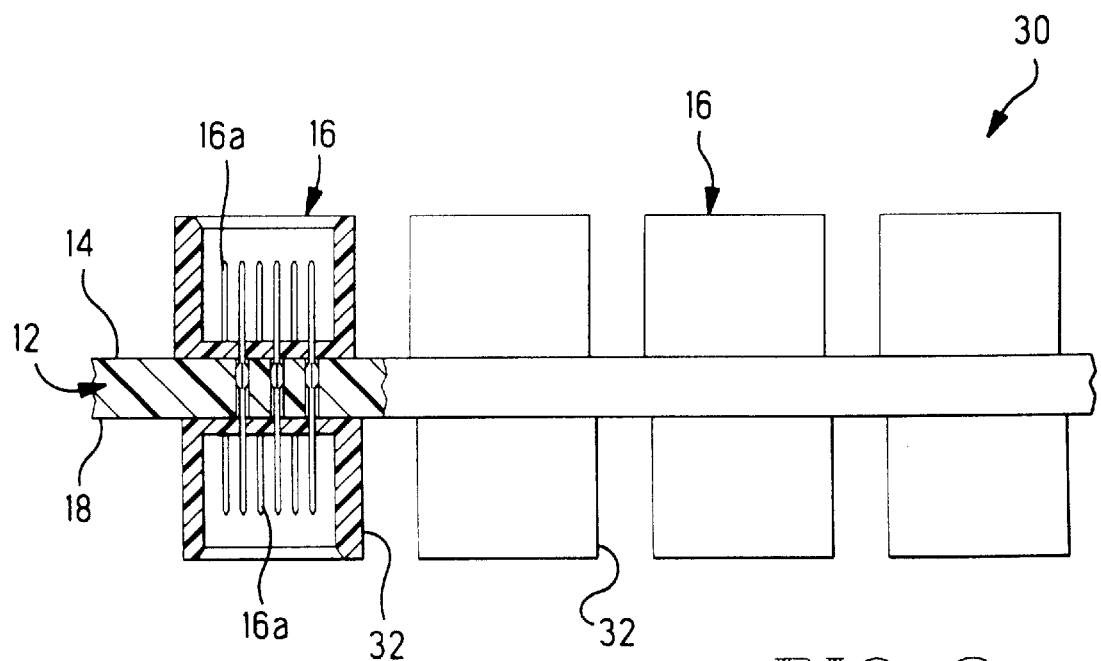
Figure 6:
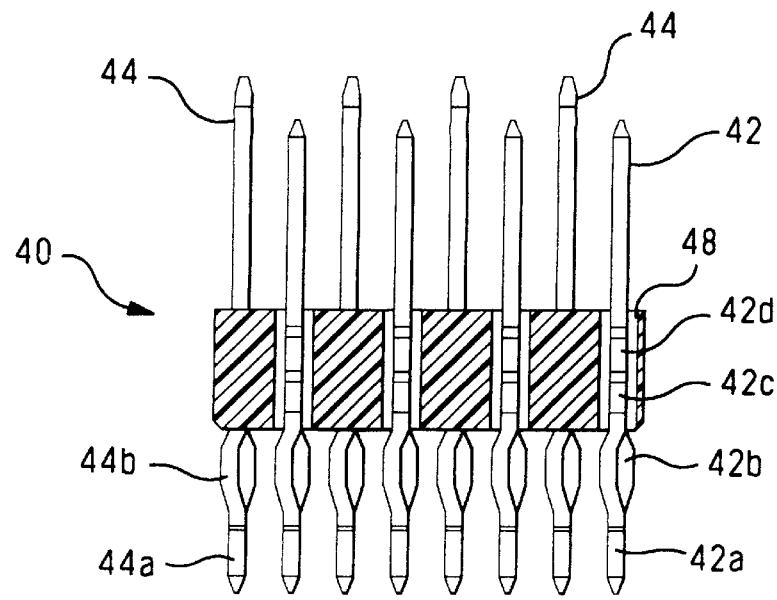
FIGS 6 is a section taken through lines 6—6 in FIG. 4.

FIGS. 3 to 6 depict a base unit 40 of the header connector and the contacts retained in this base unit. Two types of press-fit pins of two different lengths are passed through and retained in the base unit 40. Short pins are signal press-fit pins 42, and long pins are grounding press-fit pins 44. There are also power supply press-fit pins (not shown). As is shown in FIG. 6, slightly above the tips 42a,44a of the press-fit pins 42,44, there are spring-loaded sections (compliant or press-fit type) 42b,44b which can yield in the direction of the through hole diameter, and which are wider than the diameter of the through holes. These spring-loaded sections 42b,44b are forced into through holes of the back panel (not shown), thus securing the base unit on the back panel. The middle section of the press-fit pin 42 has two sharp tapers 42c and 42d. These tapers 42c and 42d cut into the inside walls of the openings 48 of the base unit 40, thus securing the press-fit pins 42 in the base unit 40. Similar tapers are made also on the press-fit pins 44 to secure them in the base unit 40. As shown in FIG. 3, three lugs (50a, 50b,50c,52a,52b,52c) are made at each end 50 and 52 of the base unit 40. As it will be explained below, these lugs 50a,50b,50c,52a,52b,52c fit into recesses 62a,62b,62c,64a, 64b,64c of the side wall unit 60 (see FIGS. 7 to 10) making it possible to attach the side wall unit 60 to, and to remove it from, the base unit 40.

FIGS. 7 to 13 depict a side wall unit 60 of the header connector. In side wall unit 60, recesses 62a,62b,62c,64a, 64b,64c are made which fit over the lugs 50a,50b,50c,52a, 52b,52c formed on the base unit 40. By putting the recesses 62a,62b,62c,64a,64b,64c over the lugs 50a,50b,50c,52a, 52b,52c in the order described below, side wall unit 60 can be secured over the side surfaces 50, 52 of the base unit 40.

Using FIGS. 14 to 18, we will explain the order in which the recesses are fit over the lugs. In this specific case, we will explain the procedures involving the installation of the side wall unit 60 over the base unit 40 mounted on the back panel 110 to which pin header unit 124 is attached.

Figure 15:
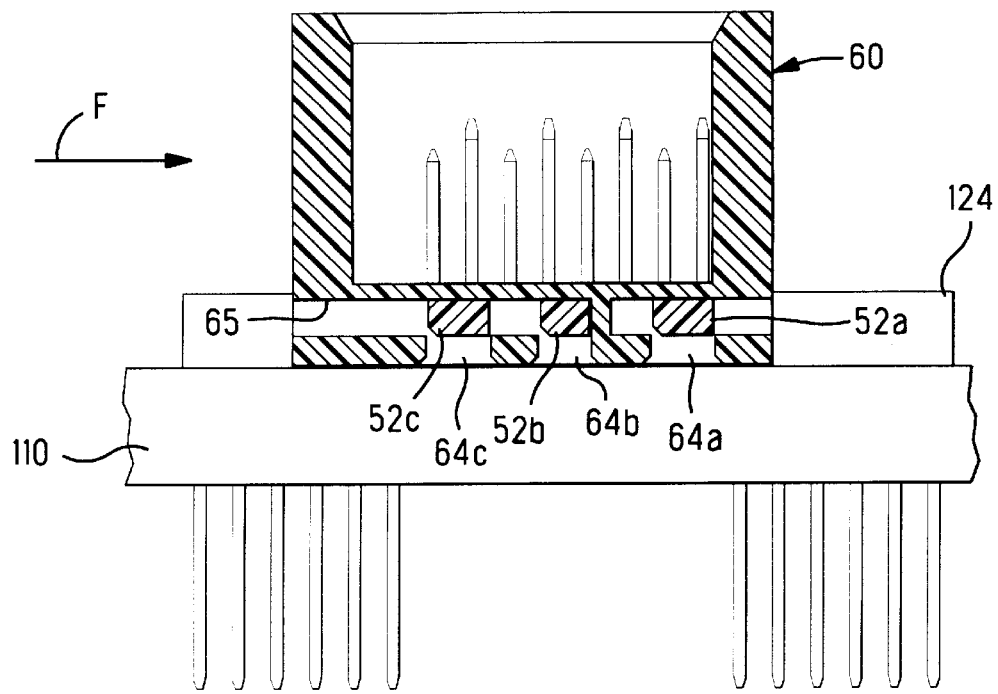
Figure 16:
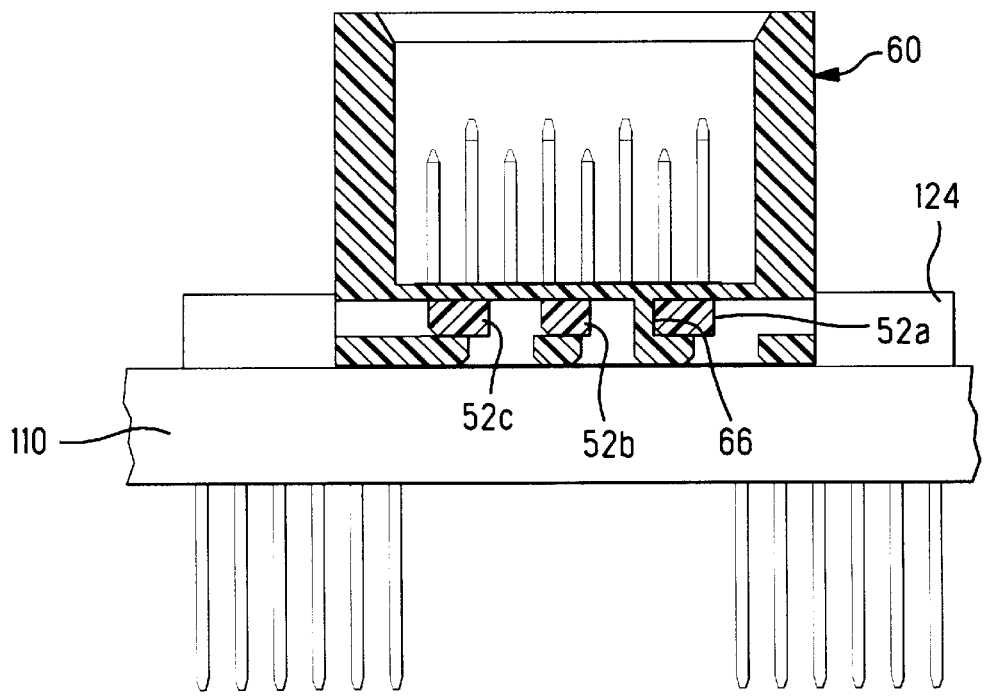
Figure 17:
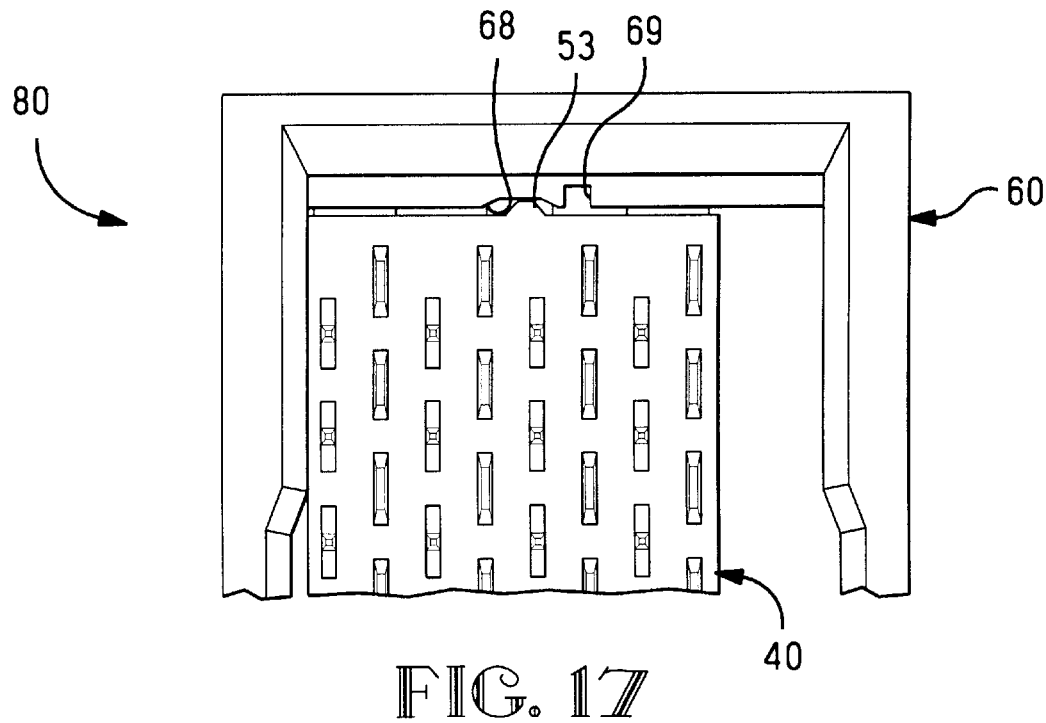
FIGS. 17 and 18 are views illustrating the engagement of the lugs of the base unit and of the recesses of the side wall unit, with FIG. 17 being a plan view showing components in the process of engagement, and FIG. 18 being a cross-section showing components after the engagement is completed.
Figure 18:
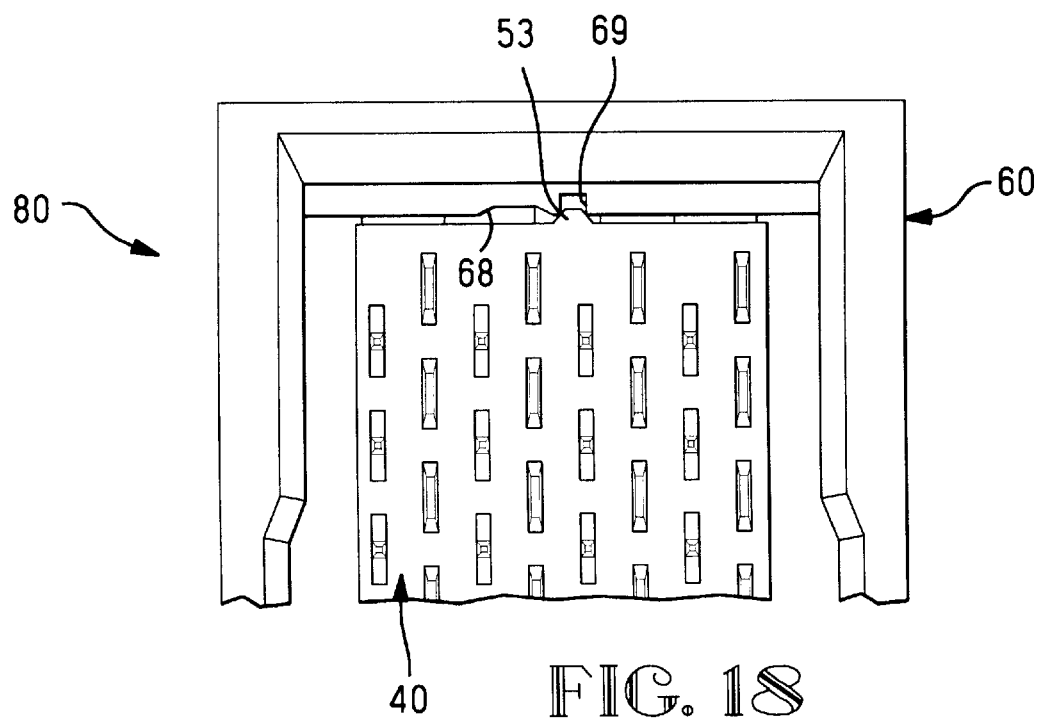

When recesses 64a,64b,64c of the side wall unit 60 are being fitted over the lugs 52a, 52b, 52c of the base unit 40, the side wall unit 60 is lowered over the base unit 40 in the direction indicated by arrow "El" (see FIG. 14) until the lugs 52a, 52b, 52c come in contact with the lower surface 65 of an upper ledge above the lower ledge through which are defined recesses 64a,64b,64c, after which the side wall unit 60 is pressed in the direction of the base unit 40 (FIG. 15). Side wall unit 60 is dimensioned to provide a clearance between the side walls to receive the base unit 40 thereinto and then subsequently be moved laterally with respect to the base unit and parallel to back panel 110. At this time, as is shown in FIG. 17, a first locking member or protrusion 53 made above the lug 52b fits into auxiliary recess 68 made above recess 64b and through the upper ledge. Then, the side wall unit 60 is moved in the direction shown by arrow "F" (FIG. 15) until lug 52a abuts wall 66 of the recess 64a (FIG. 16), and protrusion 53 is movable through a press fit with the upper ledge until it becomes seated into and engaged in a snap latching relationship with a second locking menber or later recess 69 (FIGS. 5 and 18) made above and between recesses 64b,64c (see FIG. 12). In this position, lugs 52a, 52b and 52c of the base unit 40 have passed through their respective recesses 64a, 64b and 64c of the side wall unit 60 and lock above the lower ledge, thus securing the side wall unit 60 to the side surface 52 of the base unit 40. Protrusion 53 seated in latch recess 69 inhibits undesired lateral movement of side wall unit 60, but protrusion 53 can be seen to include angled corner surfaces permitting intentional dislodgment from latch recess 69 for removal of side wall unit 60 from base unit 40. In order to remove the side wall unit 60 from the base unit 40, the above procedures are performed in the reverse order. Lugs 50a, 50b, 50c and recesses 62a,62b,62c are handled similarly and at the same time.

However, when header connectors 80 are used for the connection of a package (board) of electronic circuits (not shown in the drawing) having a number of receptacle connectors, the latter are mounted on the board with certain allowable tolerances. On the other hand, the base units 40 of the header connectors 80 are also mounted on the back panel with certain allowable tolerances. Positioning variations caused by tolerances may result in impossibility of the joining of matching connectors, or in damaging some of them. For example, if we have a package containing three receptacle connectors arrayed in a line, and if the central receptacle connector is shifted to the right relative to the central header connector 80 out of the group of three header connectors mounted on the back panel 10 in a linear array, and if the side wall unit 60 of the header connector 80 is strongly secured on the base unit 40, there is a danger that it will be impossible to connect the connectors or a connector can be damaged. In such a situation, the side wall unit 60 is designed in such a way that it can accommodate (by means of floating) deviations from the correct position caused by the insertion of a receptacle connector without damaging the connectors, thus making the joining of the connectors possible. However, protrusion 53 and latch 69, as it appears in FIGS. 17 and 18, form a tight engagement, and it seems that they do not allow for floating. If this engagement is loosened, then it will be possible for the side wall unit 60 to move easier relative to the pin header 124. Thus, by separating the header connector 80 into the base unit 40 and the side wall unit 60, and by allowing for the floating of the side wall unit 60 relative to the base unit 40, we can avoid the connector housing being damaged when receptacle connectors are joined with the header connectors according to this invention.

Figure 19:
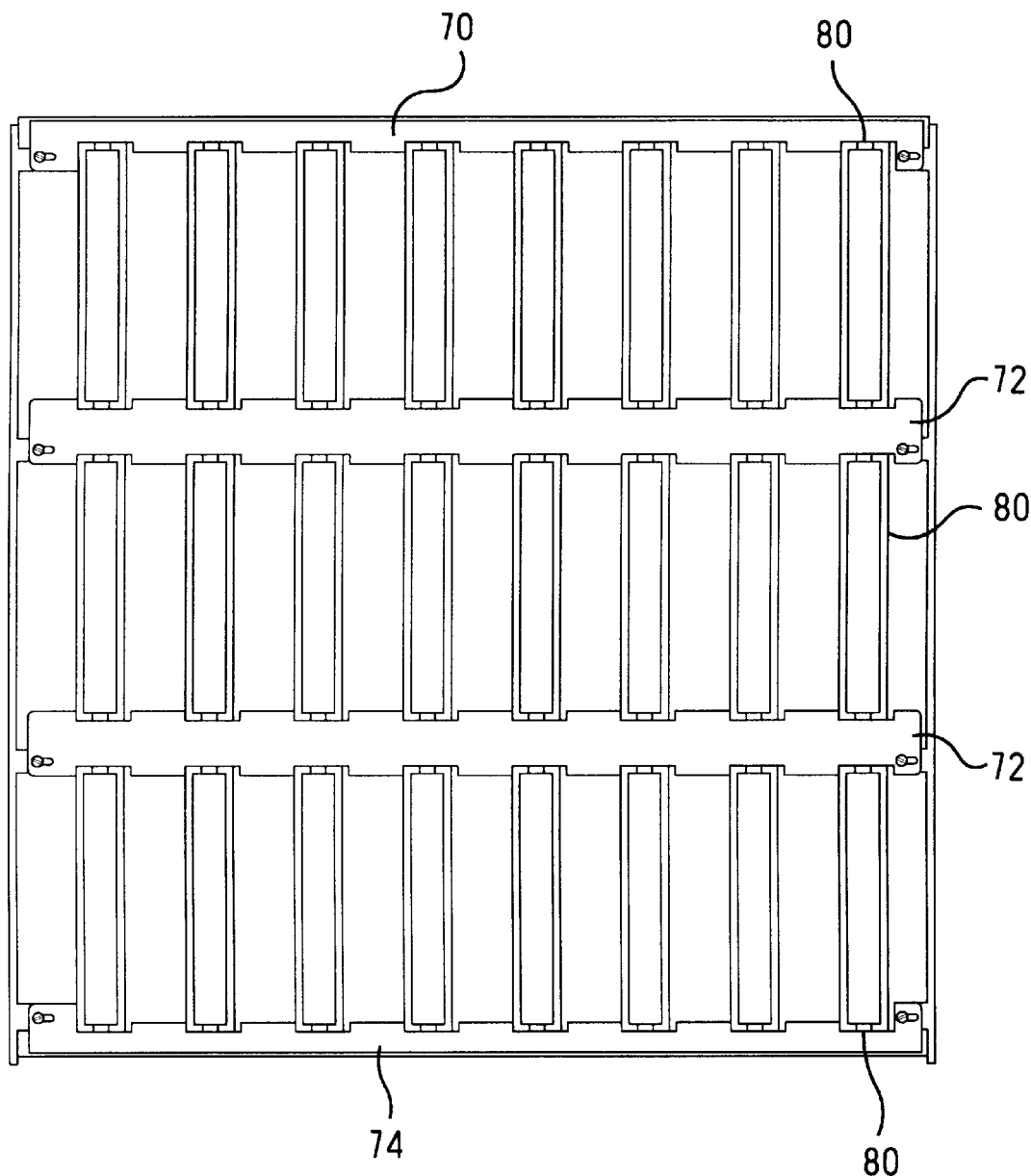
FIG. 19 is a plan view showing a method of restricting of the sliding of the side wall units by using plates secured on the back panel.

If there is a danger that the loads applied to the back panel assembly during the insertion and removal of the back panel and during the assembly of the header connectors, can exceed the strength of the engagement of the base unit 40 and the side wall unit 60 causing the side wall unit 60 together with the base unit 40 to be shifted off the position suitable for the connection, it is possible to supplement the retention strength of the side wall unit by plates 70, 72 and 74 shown in FIG. 19 which are attached by screws to a reinforcement frame (not shown) of the back panel 110.

Figure 21:
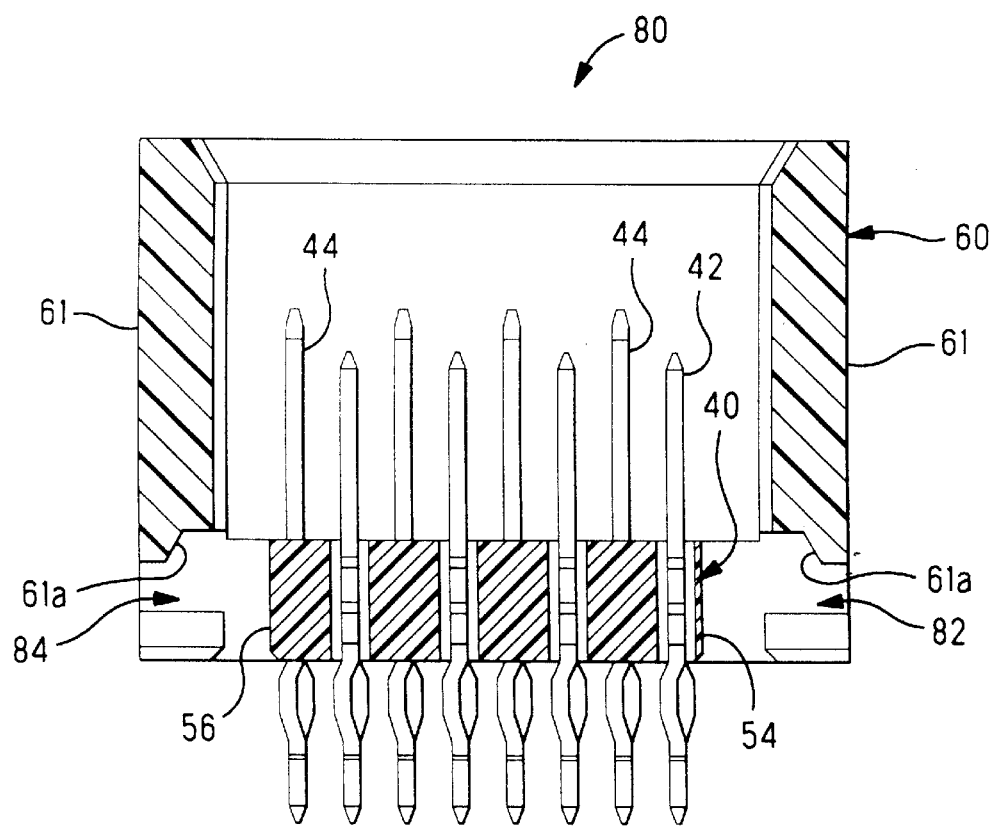
FIG. 21 is a section taken through lines 21—21 of FIG. 20.
Figure 11:
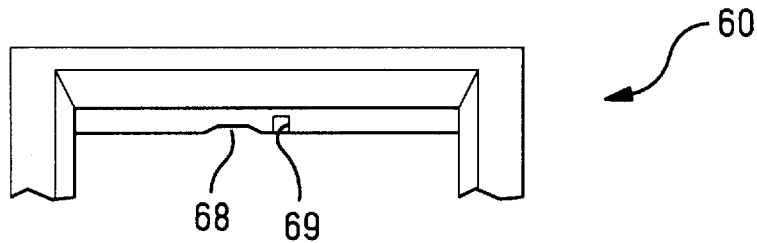
FIGS. 11 to 13 are views of the side wall unit of the header connector, with FIG. 11 being an enlarged view of detail as indicated in FIG. 7.
Figure 12:
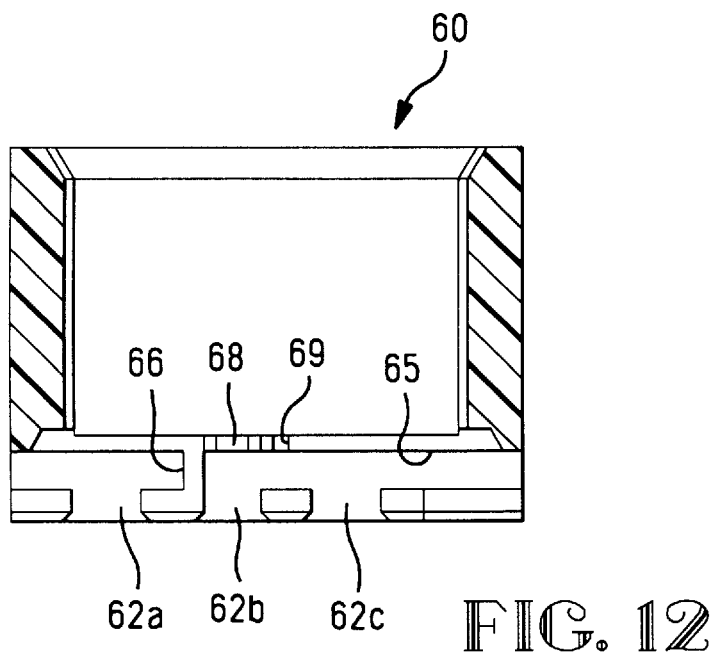
Figure 13:
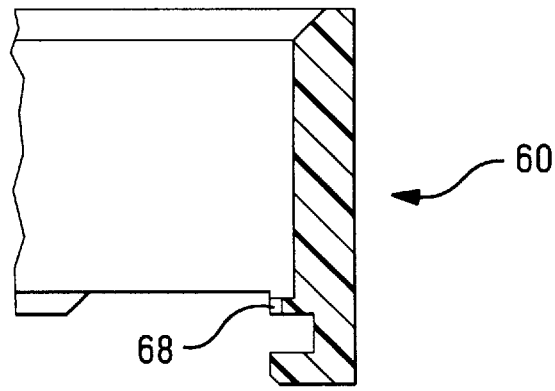
Figure 14:
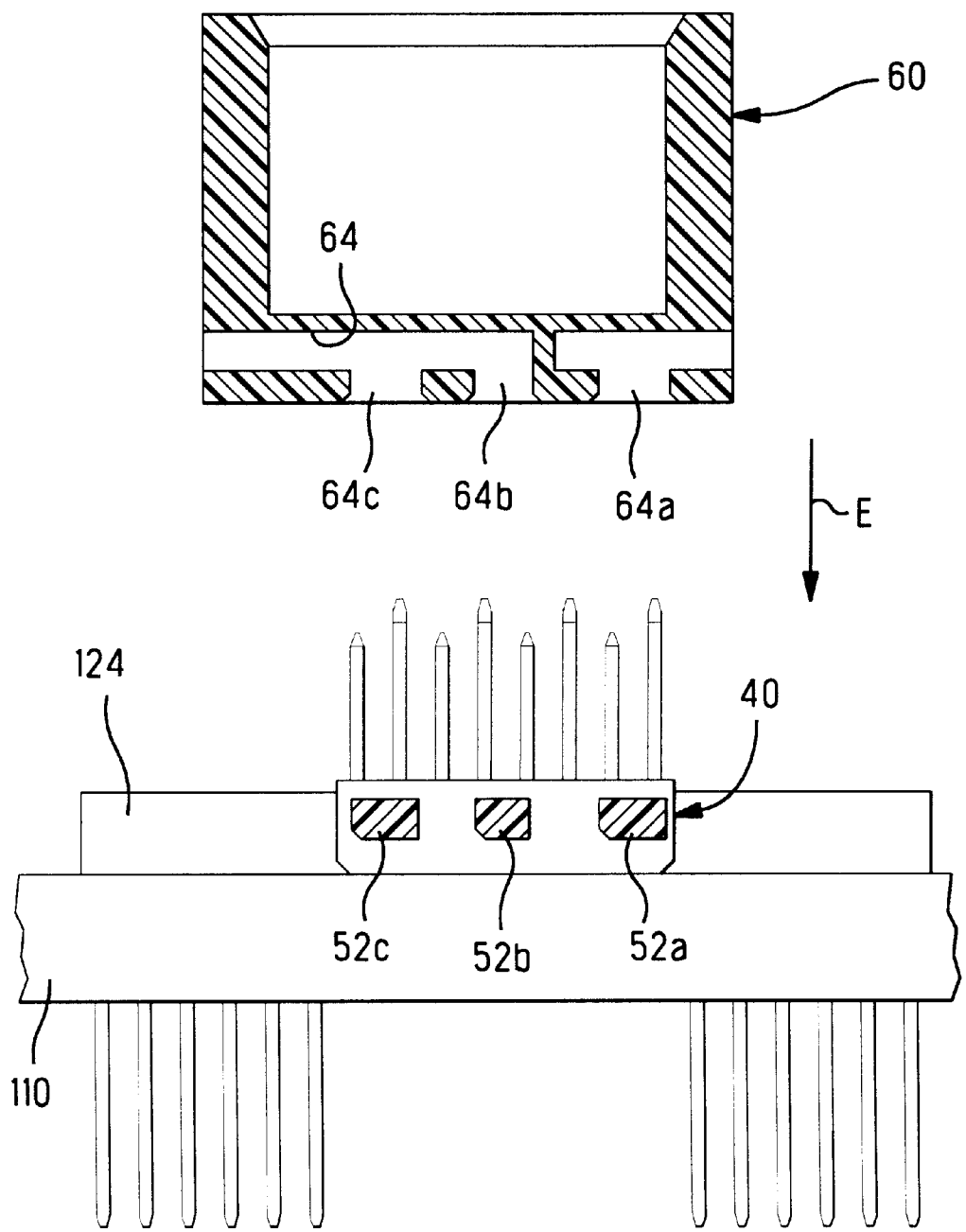
FIGS. 14 to 16 are views illustrating the engagement of the lugs of the base unit and of the recesses of the side wall unit, with FIG. 14 being a cross-section before lugs and recesses are engaged.
Figure 20:
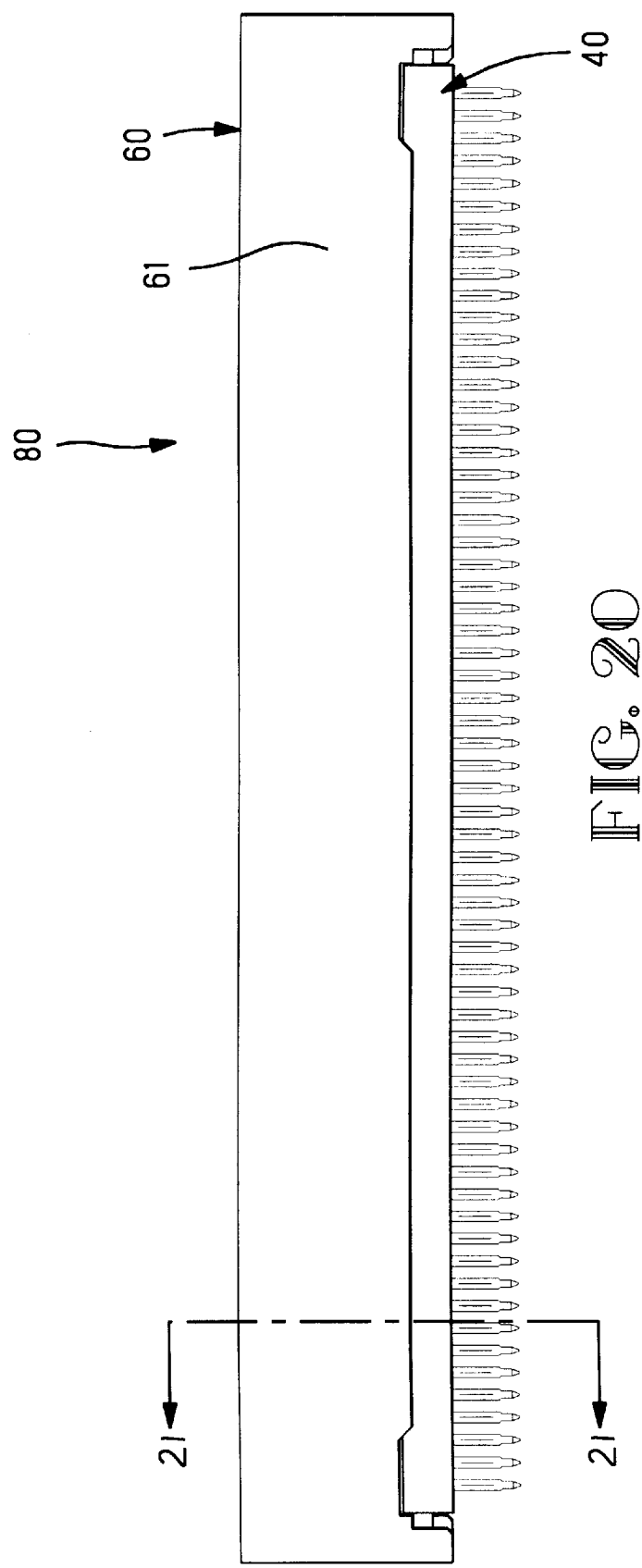
FIG. 20 is a front view of an embodiment of a header connector according to this invention.
Figure 22:
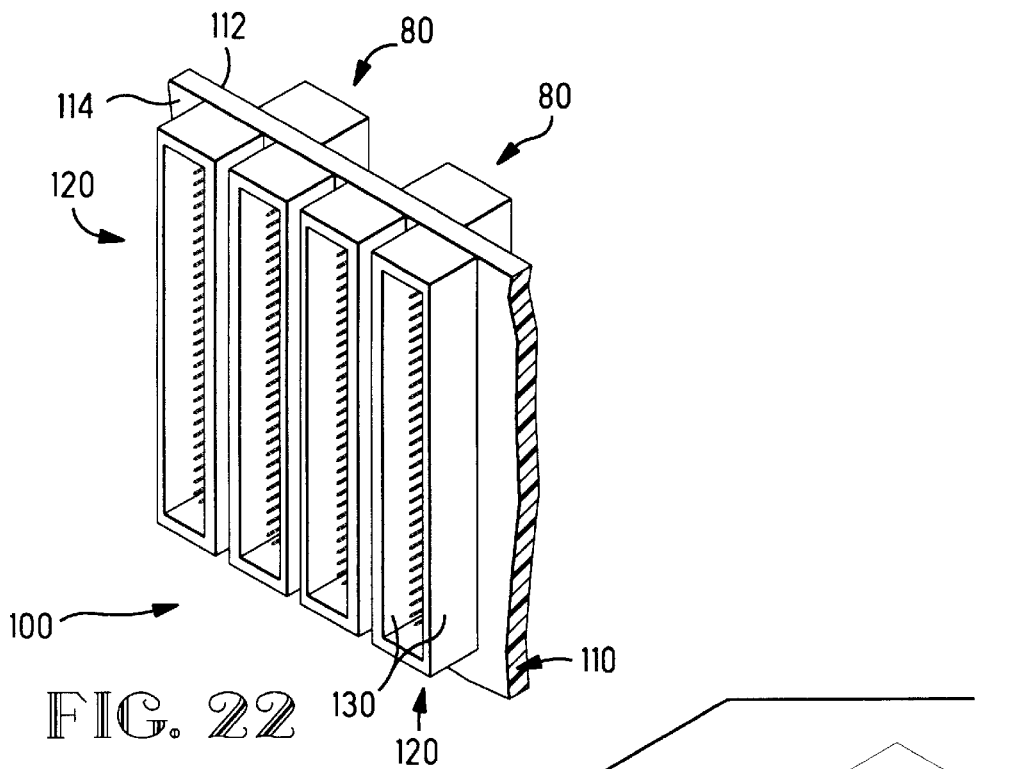
FIG. 22 is an oblique view of an embodiment of a back panel assembly according to this invention.
Figure 23:
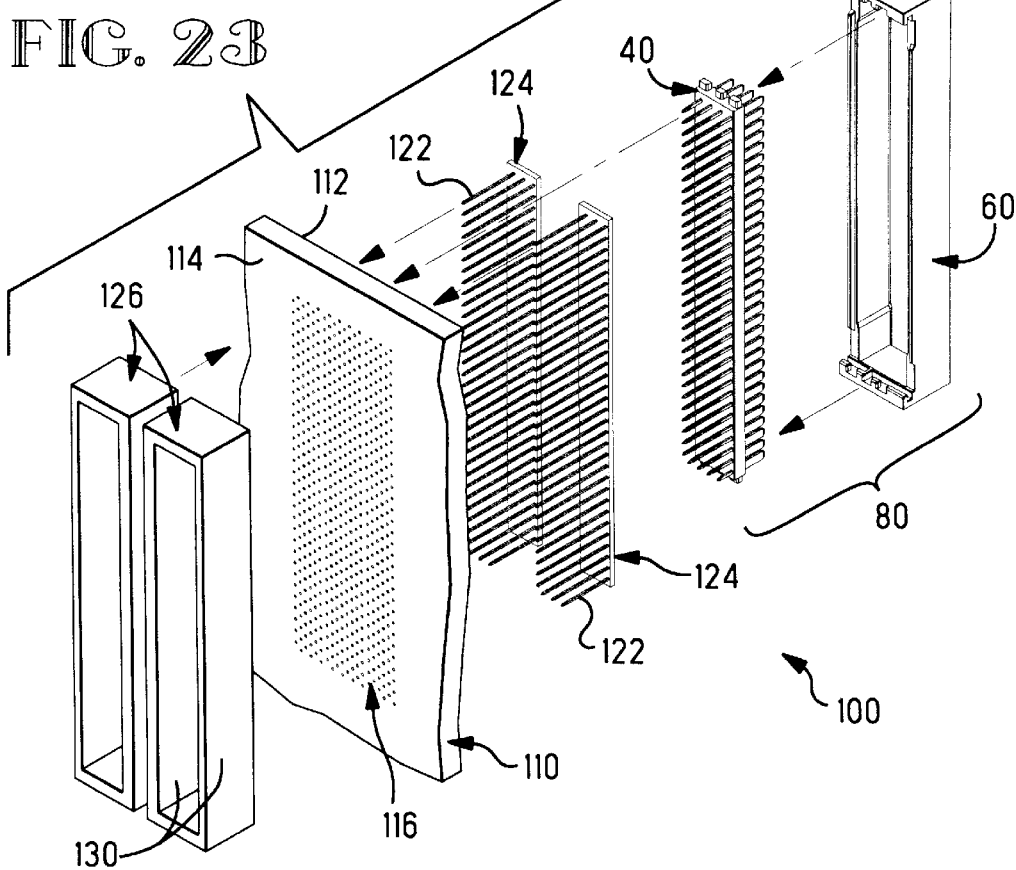
FIG. 23 is an oblique exploded view of the back panel assembly shown in FIG. 22.
Figure 24:
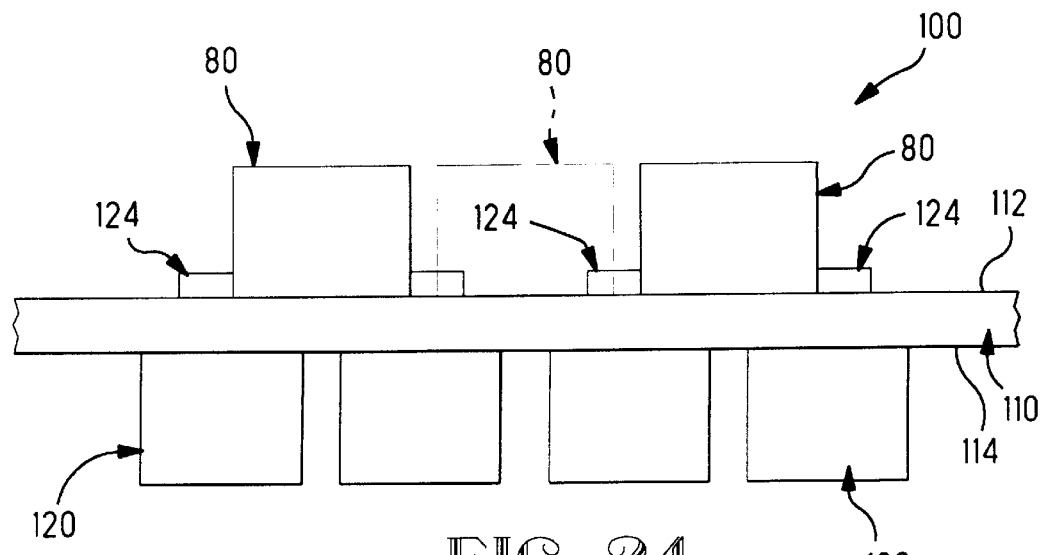
FIGS. 24 and 25 are side and cross-sectional views of the back panel assembly shown in FIG. 22.
Figure 25:
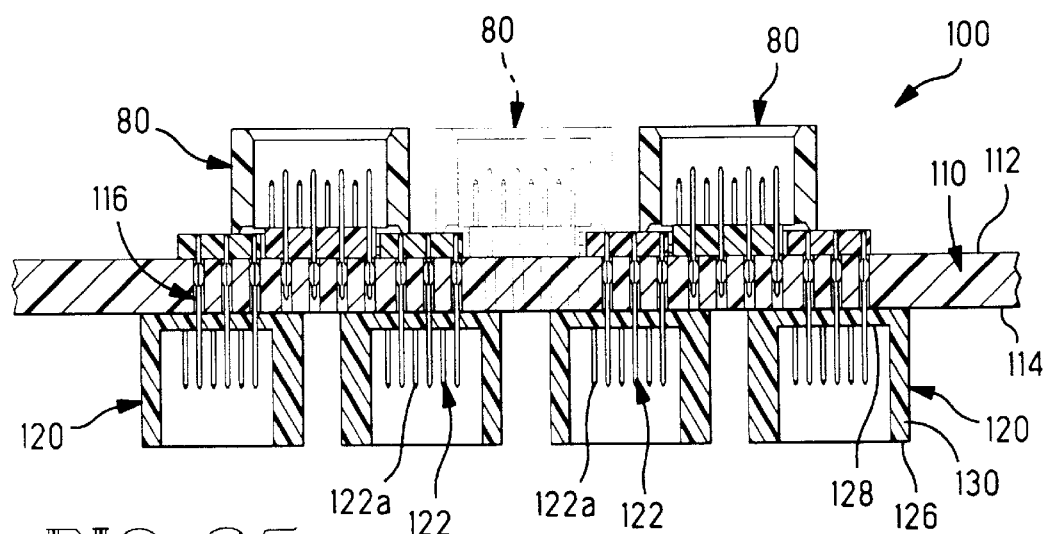
Figure 29:
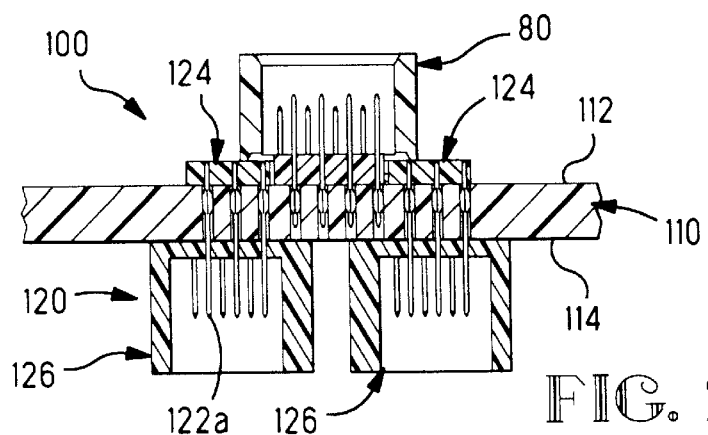
FIGS. 26 to 29 are cross sectional views illustrating steps of the assembly process of the back panel assembly shown in FIG. 22.
Figure 26:
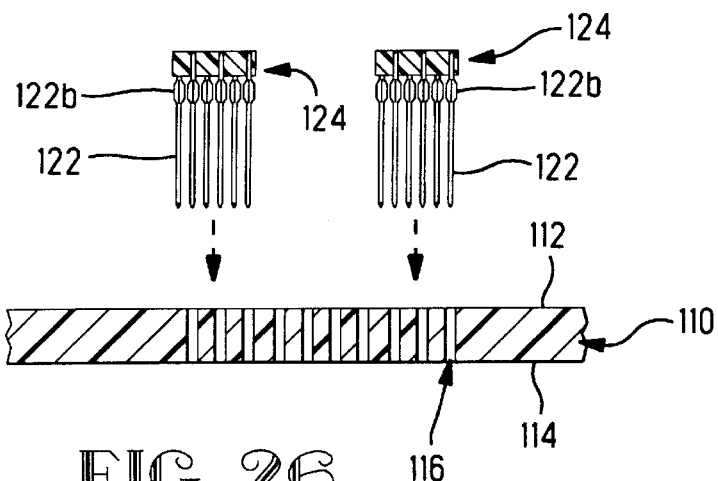
Figure 27:
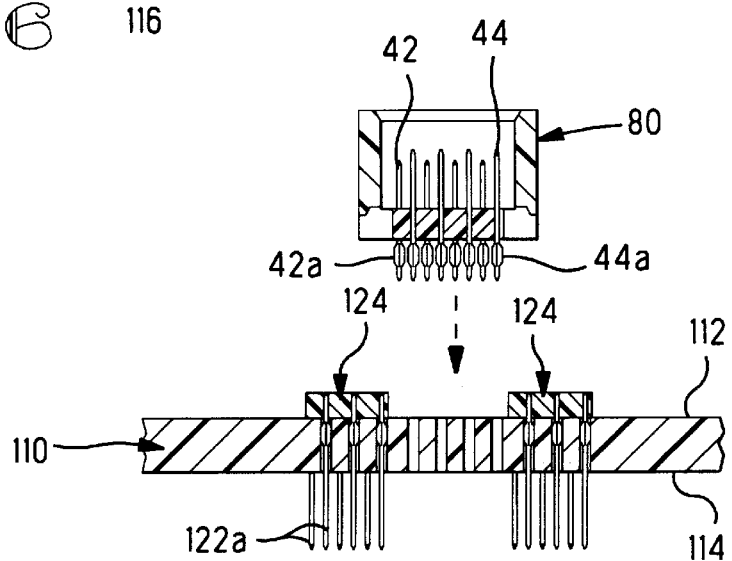

FIGS. 20 and 21 depict header connector 80 with the side wall unit 60 and the base unit 40 joined together. Components of the header connector are denoted with the same numbers as in FIGS. 3 through 19. As can be seen from FIG. 21, when side wall unit 60 is attached to base unit 40, spaces 82,84 are formed between edges 54,56 of the base unit 40 and edges 61a of lengthwise walls 61 of the side wall unit 60. These spaces 82,84 can be used, for example, for the insertion of the retention tips of strip contacts of other header connectors, thus increasing the mounting density of electronic devices. It is also possible to use these spaces for the contacts of other header connectors (not shown) mounted on the other side of the back panel (not shown). Despite that the tips of such contacts are covered by the side wall unit 60, a damaged contact of the other header connector mounted on the other side of the back panel can be easily accessed and removed from the back panel by pushing it, after the side wall unit 60 is taken off the base unit 40. Therefore, if contacts of the other header connector are bent or otherwise damaged, they can be easily replaced. The attachment of the side wall unit 60 to the base unit 40 can be done by other means as well, for example, by means of latching spring-loaded arms extending from one side of the back panel to the other.

Next, we will explain the design of the back panel assembly according to this invention, with reference to FIGS. 22 to 25. Components of the back panel assembly are denoted with the same numbers as in FIGS. 3 through 21. Back panel assembly 100 consists of the back panel 110, header connectors 80 (denoted in this invention as the first header connectors) mounted on one side 112 of the back panel 110, and header connectors 120 (denoted in this invention as the 2nd header connectors) mounted on the other side 114. Since detailed explanations of the design of the header connector 80 were given above with reference to FIGS. 3 through 21, we omit its description here.

Header connector 120 consists of a flat pin header 124 in which ends of multiple press-fit pins 122 are retained, and of a housing 126 mounted on the other side 114 of the back panel. The pin header 124 is mounted on the surface 112 of the back panel 110 so that the press-fit pins 122 pass through the through holes 116 of the back panel 110. Since both long-side edges of the pin header 124 fit into the spaces 82, 84 of adjacent header connectors 80 (see FIG. 21), the mounting density can be increased. Housing 126 has a bottom wall 128 and side walls 130. Bottom wall 128 has holes for the passage of contact sections 122a of press-fit pins 122, which are located at the ends opposite to those secured in pin header 124. Side walls 130 surround the contact sections 122a. By installing header connectors 80 shown by dot-and-dash lines in FIGS. 24 and 25, it is possible to increase mounting density even higher.

Using FIGS. 26 to 29 for reference, we will explain the process of assembling the back panel assembly.

First, pin headers 124 of header connectors 120 are mounted on one side 112 (FIG. 27) of the back panel 110 so that press-fit pins 122 retained in the pin header 124 pass through the through holes 116 (FIG. 26) to contact sections 122a. At this time, connecting sections 122b of the press-fit pins 122 are pressed in the through holes 116, thus attaching the pin header 124 to the back panel 110.

Figure 28:
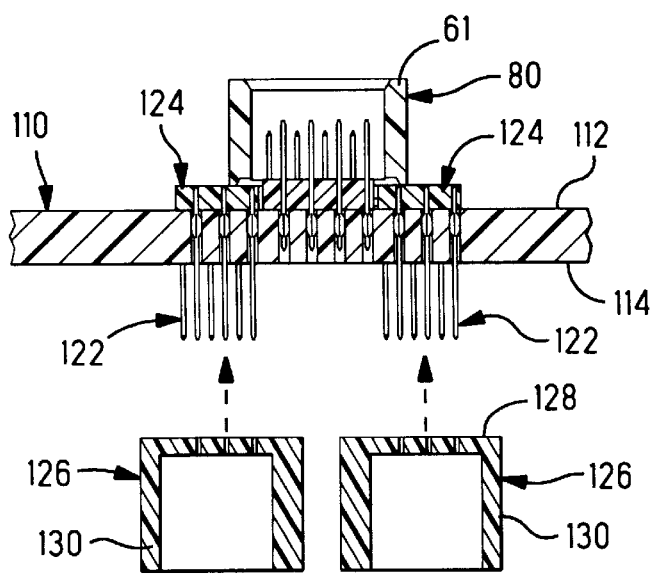

Next, header connectors 80 are mounted on side 112 of the back panel 110 between pin headers 124 so that the lengthwise edges of the pin headers 124 mounted on the same side fit into the spaces 82,84 (see FIG. 21) of the header connector 80 (FIG. 28). Since connecting sections 42a,44a formed respectively on the stems of the press-fit pins 42 and 44 are pressed into through holes 116, the header connector 80 is attached to the back panel 110. Since the lengthwise edges of the pin headers 124 fit into the spaces 82,84 of header connectors 80, there is no interference between side walls 61 of the header connector 80 and pin headers 124. The length of press-fit pins 42,44 is such that their ends do not extend beyond the other side 114 of the back panel 110. After header connectors 80 are mounted on the back panel 110, housings 126 are mounted on the other side 114 of the back panel 110. During the mounting, connecting sections 122a of press-fit pins 122 are passed through holes made in the bottom wall 128 of the housing 126. Therefore the contacts (press-fit pins) of the header connectors 80,120 are inserted in the same direction (in this specific case, from the side 112 of the back panel 110) which makes the assembly operations easier and makes it possible to use only one jig to support the back panel during the assembly and to reduce the number of operations. As the result, the assembly process of the back panel assembly 100 becomes relatively easier.

An explanation of the operation of the present invention, and its advantages, will now be described. Since the side wall unit of the header connector according to this invention is of a removable type, it can be easily attached to and removed from the base unit. Therefore, if header connectors are secured on one side of a back panel and on the opposite side of the same panel, and if a tip of a contact of a header connector according to this invention is blocked by a side wall unit of a header connector mounted on the other side of the back panel, it is possible to remove said side wall unit, thus gaining access to the tip of the contact in question, and to take it out by pressing on its tip. Thus, if a contact is bent or otherwise damaged, it can be easily replaced with a good one. In order to replace a contact in a conventional header connector, it is necessary to form a clearance space in front of the contact tip, which results in the presence of dead spaces and a lower density of the header connector mounting. With the header connectors according to this invention, even if the space in front of a damaged contact tip is covered with the side wall unit of a header connector mounted on the opposite side of the back panel, said side wall unit can be removed, providing for an easy removal of the header connector contact from the back panel. Therefore, contacts can be easily replaced without reduction in the density of the mounting of header connectors. In addition, in the area enclosed between the edges of the base unit and the edges of the side wall unit, a space is formed which can accommodate a part of other connector. Since a header connector can accommodate in this space a portion of another connector mounted next to it, the density of the mounting of the header connectors can be increased.

Since, with the back panel assembly according to this invention, a part of the pin header unit of the second header connector can be mounted to the back panel in a state when it is located in the space of the first header connector, it becomes possible to correspondingly increase the mounting density. Moreover, the efficiency of the mounting of the header connectors is increased due to the fact that the first and second header connectors have their own contacts rather than common contacts, if the area in the front of a contact of a second header connector is blocked by the side wall unit of the first header connector, said side wall unit can be detached from the base unit and the contact of the second header connector can be easily removed from the back panel. This makes it possible to replace bent contacts without compromising the mounting density of the first header connectors. Similarly, if a contact of the first header connector is blocked by the housing of the second header connector, this housing can be pulled of f the contact of the first header connector and the contact can be removed from the back panel. Therefore, damaged contacts of the first header connector can be easily replaced without compromising the mounting density of the second header connectors.

According to the method of assembly of the back panel assemblies according to this invention, the contacts of the first and the second header connectors are inserted in the back panel through holes from the same side. Compared to the insertion from different sides, this method provides for a relatively easier operation. Since the second header connector can be mounted to the back panel in a state when a part of the pin header unit is contained in the space of the first header connector, it is possible to correspondingly increase the mounting density. If the area in the front of a contact of the second header connector is blocked by the side wall unit of the first header connector, said side wall unit can be detached from the base unit and the contact of the second header connector can be easily removed from the back panel. This makes it possible to replace bent contacts without reducing the mounting density of the first header connectors. Similarly, if a contact of the first header connector is blocked by the housing of a second header connector, this housing can be pulled off the contact of the first header connector and the contact can be removed from the back panel. Therefore, bent contacts of the first header connector can be easily replaced without compromising the mounting density of the second header connectors.

As follows from the above explanations, in the header connector according to this invention, it is possible to form vacant spaces by detaching the side wall unit from the base unit. Through holes coinciding with these vacant spaces can be used for the insertion of contacts of other header connectors which can be easily removed if necessary. Therefore, in the event of bending or damage of a contact of the other header connector, it can be easily replaced with a good one without compromising the density of mounting.

By using the back panel assembly according to this invention, it is possible to install pin headers of the second header connectors so that their portions come in the areas occupied by the first header connectors, thus making it possible to increase the mounting density by the amount proportional to these portions. Moreover, since the contacts of the first and second header connectors are not common, the efficiency of the mounting of the header connectors is also increased.

The method of assembly of the back panel assemblies according to this invention makes it possible to insert the contacts of both the first and the second header connectors in the through holes from the same side of the back panel, which makes the assembly operations considerably easier compared to assembly when the contacts are inserted from both sides of the back panel.

What we claim is:

1. A header connector (80) having multiple pin-shaped contacts (42,44) having insertion sections (42b,44b) which are retained in through holes (116) formed in a back panel (110), and pin contact sections that extend into a cavity of said header that is perimetrically enveloped by a shroud, comprising:

a separable base unit (40) and a side wall unit (60), said side wall unit (60) defining the shroud side walls, said base unit (40) retaining multiple contacts (42,44) passing through it;

said base unit (40) defines a bottom wall having end edges and side edges, and said base unit includes a first locking member (53) on at least one of said end edges; and said side wall unit has a second locking member (69) adjacent a bottom end edge thereof, and said side wall unit (60) is snap latchable to said base unit (40) via said first and second locking members; and said side wall unit provides a clearance within said side walls at said bottom edges thereof enabling said side wall unit to receive thereinto said base unit and subsequently move laterally with respect thereto parallel to the back panel, whereby said side wall unit (60) is attachable to said base unit (40) after assembly of said base unit to the back panel (110).

2. The header connector as set forth in claim 1 further wherein said side wall unit (60) and said base unit (40) are adapted to permit removal of said side wall unit from said base unit.

3. The header connector as set forth in claim 1 further wherein said base unit (40) and said side wall unit (60) are snap latchable in a lateral direction.

4. The header connector as set forth in claim 1 further wherein said base unit (40) has opposed end edges and said side wall unit (60) has opposed end walls associated with said end edges, at least one end edge of said base unit (40) includes a protrusion (53), and at least one said end wall of said side wall unit (60) includes a corresponding auxiliary recess (68) through a ledge thereof permitting passage of said protrusion (53) therethrough during connector assembly to a position above said ledge, and said ledge further including a latch recess (69) laterally of said auxiliary recess (68) within which said protrusion (53) seats to inhibit incidental lateral movement of said side wall unit after assembly.

5. The header connector as set forth in claim 1 wherein said side wall unit (60) is an integral member fabricated from insulative material.

6. A header connector (80) having multiple pin-shaped contacts (42,44) having insertion sections (42b,44b) which are retained in through holes (116) formed in a back panel (110), and pin contact sections that extend into a cavity of said header that is perimetrically enveloped by a shroud, comprising:

a separable base unit (40) and a side wall unit (60), said side wall unit (60) defining the shroud side walls, said base unit (40) retaining multiple contacts (42,44) passing through it, said side wall unit (60) is attachable to said base unit (40) after assembly of said base unit to the back panel (110);

said base unit (40) defines a bottom wall having end edges and side edges, and said base unit includes a first locking member (53) on at least one of said end edges; and said side wall unit has a second locking member (69) adjacent a bottom end edge thereof, and said side wall unit (60) is snap latchable to said base unit (40) via said first and second locking members; and side edges of said base unit (40) and bottom surfaces of said side walls of said side wall unit (60) together define clearance spaces for the receipt thereinto of parts of other connectors mounted to the back panel (110).

7. A header connector (80) having multiple pin-shaped contacts (42,44) having insertion sections (42b,44b) which are retained in through holes (116) formed in a back panel (110), and pin contact sections that extend into a cavity of said header that is perimetrically enveloped by a shroud, comprising:

a separable base unit (40) and a side wall unit (60), said side wall unit (60) defining the shroud side walls, said base unit (40) retaining multiple contacts (42,44) passing through it, said side wall unit (60) is attachable to said base unit (40) after assembly of said base unit to the back panel (110); and at least one end edge of said base unit includes at least one lug extending laterally therefrom spaced from the back panel, and a corresponding at least one end wall of said side wall unit includes a corresponding at least one recess through a ledge extending inwardly from a bottom surface of end wall thereof adapted to permit receipt therealong of said at least one lug during assembling of said side wall unit to said base unit until a top surface of said ledge passes a bottom surface of said lug permitting lateral movement of said side wall unit to position said at least one lug along a top surface of said ledge, securing said side wall unit to said base unit.

8. The header connector as set forth in claim 7 wherein both end edges of said base unit (40) each include at least one said lug (50a,50b,50c,52a,52b,52c), and both end walls of said side wall unit (60) each include a said ledge having a corresponding at least one said recess (62a,62b,62c,64a, 64b,64c) extending therethrough, such that upon assembly of said header connector said lugs of said ends of said base unit (40) are disposed along said top surfaces of said ledges permitting said lateral movement of said side wall unit (60).

9. A header connector (80) having multiple pin-shaped contacts (42,44) having insertion sections (42b,44b) which are retained in through holes (116) formed in a back panel (110), and pin contact sections that extend into a cavity of said header that is perimetrically enveloped by a shroud, comprising:

a separable base unit (40) and a side wall unit (60), said side wall unit (60) defining the shroud side walls, said base unit (40) retaining multiple contacts (42,44) passing through it, said side wall unit (60) is attachable to said base unit (40) after assembly of said base unit to the back panel (110);

said first header connector being mounted on a first side of a back panel, further characterized by at least one second header connector including a low profile pin header unit mounted on the opposite side of the back panel adjacent said base unit of said first header, said pin header unit retaining therein ends of second contacts passing through said through holes of a second array, and said second header connector further including a housing being mounted on said first side of the back panel and having a bottom wall through which pass contact sections of said second contacts located at leading ends remote from said ends secured in said pin header unit, said housing including side walls surrounding said contact sections and a space is formed by at least one side edge of said base unit and a bottom surface of said side wall unit of said first header connector adjacent said one side edge, defining a clearance for receipt thereinto of a complementary portion of said pin header unit.

10. The back panel assembly as set forth in claim 9 further wherein said space (82,84) is formed along both side edges of said base unit (40) and bottom surfaces of said side wall unit (60) along both said side edges, defining clearances for receipt thereinto of complementary portions of respective said pin header units (124).

11. A method of assembling a back panel assembly, comprising the steps of:

providing a back panel (110) having adjacent first and second arrays of multiple through holes (116) extending from one side (112) thereof to an opposed other side (114);

providing a first header connector (80) having a low profile base unit and a removable side wall unit, said connector further having first contacts (42,44) having insertion sections (42b,44b) proximate to ends thereof exposed to be inserted into said through holes of said first array from said one side (112) of said panel, said low profile base unit (40) retaining said first contacts passing through it, and said removable side wall unit (60) attached to said base unit (40) forming a space (82,84) between said side wall unit (60) and said base unit (40) adjacent to at least one side edge of said base unit (40) and to a bottom surface of a side wall of said side wall unit (60) along said one side edge;

providing a second header connector (120) having a low profile pin header unit (124) retaining ends of second contacts (122) and a housing (126) having a bottom wall (128) through which will pass contact sections (122a) of said second contacts (122) secured in said pin header unit (124), and further having side walls (130) surrounding said contact sections (122a) along the other side (114) of the back panel, after assembly of said second header connector (120) to the back panel (110);

mounting said pin header unit (124) of said second header connector (120) to said one side (112) of the back panel (110) in such a manner that the said contact sections (122a) of said second contacts (122) pass through said through holes (116) of said second array and are exposed along said other side (114) of said panel; and mounting said first header connector (80) to said one side (112) of the back panel (110) by securing said base unit (40) to said panel by insertion of said first contact insertion sections (42b,44b) into said first array of through holes adjacent said pin header unit (124) in such a manner that a portion of said pin header unit mounted on said one side, occupies said space (82,84) provided for this purpose in said first header connector (80) adjacent to said side edges of said base unit (40) thereof, as said insertion sections (42b,44b) of said first contacts (42,44) are inserted into said through holes (116) of said first array.

12. The method as set forth in claim 11 further comprising the step of mounting said housing (126) of said second header connector (120) to said other side (114) of the back panel (110) in such a manner that said contact sections (122a) of said second contacts (122) located at leading ends remote from said ends secured in said pin header unit (124), pass through said bottom wall (128) of said housing (126).

13. A header connector (80) having multiple pin-shaped contacts (42,44) having insertion sections (42b,44b) which are retained in through holes (116) formed in a back panel (110), and pin contact sections that extend into a cavity of said header that is perimetrically enveloped by a shroud, comprising:

a separable base unit (40) and a side wall unit (60), said side wall unit (60) defining the shroud side walls, said base unit (40) retaining multiple contacts (42,44) passing through it;

said base unit (40) is a flat member having end edges and side edges to be disposed adjacent and along said back panel (110);

said side wall unit (60) is an integral member of insulative material; and said side wall unit provides a clearance within said side walls at said bottom edges thereof enabling said side wall unit to receive thereinto said base unit and subsequently move laterally with respect thereto parallel to the back panel, whereby said side wall unit (60) is attachable to said base unit (40) after assembly of said base unit to the back panel (110).

14. The header connector as set forth in claim 13 wherein said base unit (40) includes a first locking member (53) on a said end edge, said side wall unit (60) having opposed end walls and side walls and includes a second locking member (69) adjacent a bottom edge of a said end wall, said side wall unit (60) provides a bottom opening larger in dimension between side walls thereof than said base unit to receive said base unit thereinto and permit said side wall unit to be urged in a lateral direction to become snap latchable to said base unit.

* * * * *